(12) United States Patent
Chen

(10) Patent No.: US 9,034,672 B2
(45) Date of Patent: May 19, 2015

(54) METHOD FOR MANUFACTURING LIGHT-EMITTING DEVICES

(75) Inventor: Chao-Hsing Chen, Tainan (TW)

(73) Assignee: EPISTAR CORPORATION, Hsinchu (TW)

( * ) Notice: Subject to any disclaimer, the term of this patent is extended or adjusted under 35 U.S.C. 154(b) by 131 days.

(21) Appl. No.: 13/527,139

(22) Filed: Jun. 19, 2012

(65) Prior Publication Data

US 2013/0337591 A1 Dec. 19, 2013

(51) Int. Cl.
| | |
|---|---|
| *H01L 21/00* | (2006.01) |
| *H01L 33/48* | (2010.01) |
| *H01L 33/58* | (2010.01) |
| *H01L 33/62* | (2010.01) |

(52) U.S. Cl.
CPC .............. *H01L 33/48* (2013.01); *H01L 33/483* (2013.01); *H01L 33/58* (2013.01); *H01L 33/486* (2013.01); *H01L 33/62* (2013.01)

(58) Field of Classification Search
CPC ......... H01L 33/48; H01L 33/58; H01L 33/62; H01L 33/483; H01L 33/486
USPC ........ 438/27, 28, 29, 118, 26; 257/98, 99, 81, 257/E33.056, E33.057
See application file for complete search history.

(56) References Cited

U.S. PATENT DOCUMENTS

| 7,276,739 B2 | 10/2007 | Chen et al. |
| 7,838,897 B2 | 11/2010 | Higashi et al. |
| 2006/0157722 A1* | 7/2006 | Takezawa et al. ............... 257/98 |
| 2008/0081400 A1* | 4/2008 | Doi et al. ....................... 438/118 |
| 2011/0024786 A1* | 2/2011 | Sugiyama ........................ 257/99 |
| 2011/0163426 A1* | 7/2011 | Shen et al. ..................... 257/668 |
| 2012/0244652 A1* | 9/2012 | Chen et al. ...................... 438/27 |

FOREIGN PATENT DOCUMENTS

WO 2012/01235 A2 1/2012

* cited by examiner

*Primary Examiner* — Kimberly Rizkallah
*Assistant Examiner* — Maria Ligai
(74) *Attorney, Agent, or Firm* — Ditthavong & Steiner, P.C.

(57) ABSTRACT

A method of manufacturing a light-emitting device includes forming a first optical element on a first carrier, wherein the first optical element comprises an opening; forming a light-emitting element in the opening; forming a second optical element on the light-emitting element; forming a second carrier on the first optical element and the second optical element; removing the first carrier after forming the second carrier on the first optical element and the second optical element; and forming two separated conductive structures under the first optical element.

19 Claims, 6 Drawing Sheets

METHOD FOR MANUFACTURING LIGHT-EMITTING DEVICES

BACKGROUND

1. Technical Field

The present disclosure relates to a light-emitting device, and more particularly, to a light-emitting device having multiple optical elements and a manufacturing method thereof.

2. Description of the Related Art

An optoelectronic device, such as a light-emitting diode (LED) package, has been applied widely to optical display devices, traffic signals, data storing devices, communication devices, illumination devices, and medical apparatuses. The LED can be connected with other elements to form a light-emitting device. FIG. 1 illustrates a schematic view of a conventional light-emitting device. A conventional light-emitting device 1 includes a submount 12 with a circuit 14; a solder 16 on the submount 12, wherein an LED 11 is adhesively fixed on the submount 12 by the solder 16; and an electrical-connecting structure 18 electrically connecting the n-type electrode 15 with the circuit 14. The submount 12 can be a lead frame or a mounting substrate for circuit design and heat dissipation of the light-emitting apparatus 1. However, because of the trend of small and slim commercial electronic product, the development of the optoelectronic device also enters an era of miniature package. One promising packaging design for semiconductor and optoelectronic device is the Chip-Level Package (CLP).

SUMMARY OF THE DISCLOSURE

A method of manufacturing a light-emitting device includes forming a first optical element on a first carrier, wherein the first optical element comprises an opening; forming a light-emitting element in the opening; forming a second optical element on the light-emitting element; forming a second carrier on the first optical element and the second optical element; removing the first carrier after forming the second carrier on the first optical element and the second optical element; and forming two separated conductive structures under the first optical element.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
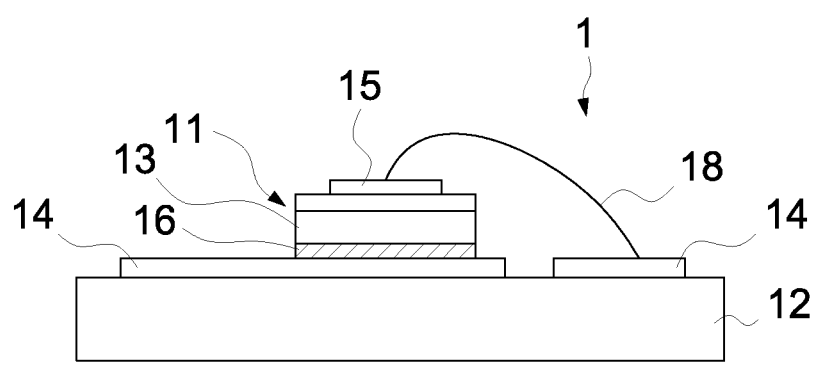
FIG. 1 illustrates a cross-sectional view of a conventional light-emitting device.
Figure 2A:
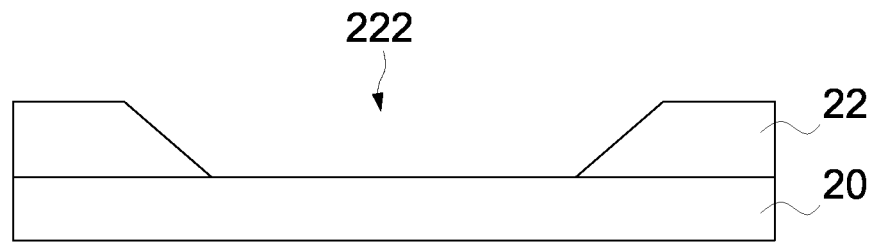
FIGS. 2A-2D illustrate a flow chart of the manufacturing process of a light-emitting device in accordance with an embodiment of the present application.
Figure 2B:
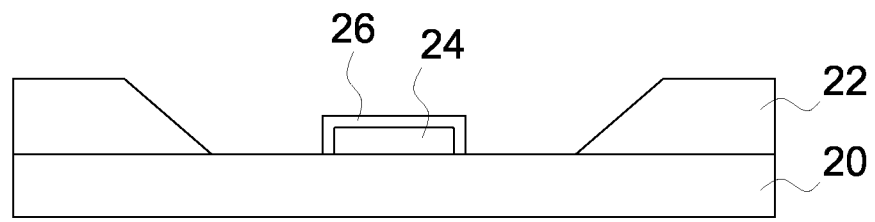
Figure 2C:
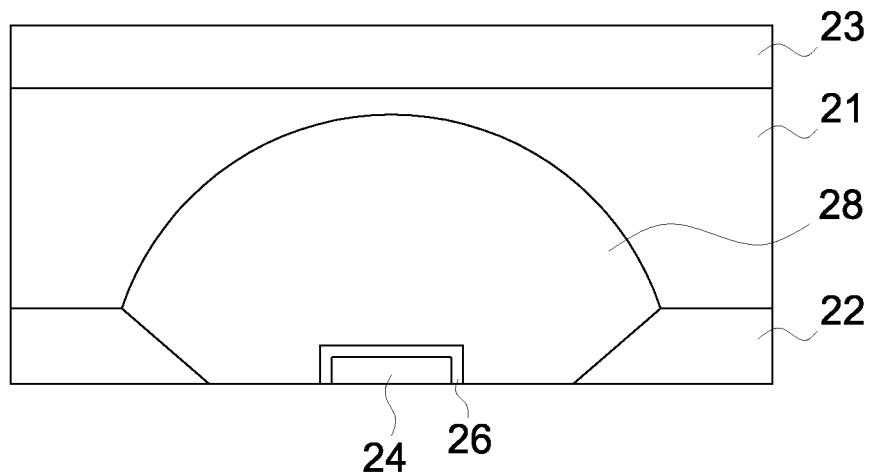
Figure 2D:
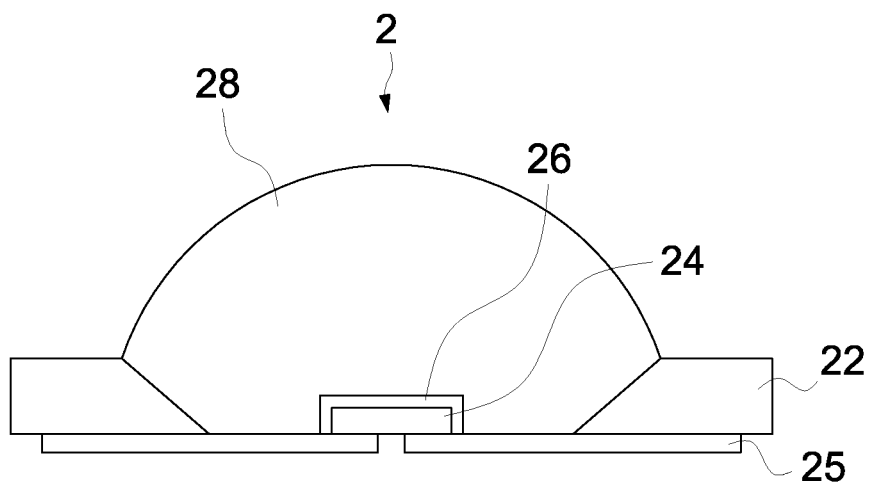

FIGS. 2A-2D illustrate a flow chart of the manufacturing process of a light-emitting device 2 in accordance with an embodiment of the present disclosure. Referring to FIG. 2A, a first optical element 22 is formed on a first carrier 20 and includes an opening 222 to expose the first carrier 20. A light-emitting element 24 is formed on the exposed portion of the first carrier 20 and a wavelength-converting layer 26 is formed on the light-emitting element 24, as shown in FIG. 2B. In another embodiment, an electronic component (not shown) can be formed on the first carrier 20 as well. Referring to FIG. 2C, a second optical element 28 is formed on the wavelength-converting layer 26. A bonding layer 21 is formed under a second carrier 23, and/or on the first optical element 22 and the second optical element 28. The second carrier 23 is bonded to the second optical element 28 through a bonding process. The first carrier 20 is removed. A conductive structure 25 is formed under the first optical element 22 and the light-emitting element 24 to form the light-emitting device 2, wherein the conductive structure 25 is electrically connected with the light-emitting element 24.

The first carrier 20 and/or the second carrier 23 support the first optical element 22, the second optical element 28, and the light-emitting element 24. The material of the first carrier 20 and/or the second carrier 23 includes conductive material such as Diamond Like Carbon (DLC), Metal Matrix Composite (MMC), Ceramic Matrix Composite (CMC), Polymer Matrix Composite (PMC), Cu, Al, Si, Mo, Cu—Sn, Cu—Zn, Cu—Cd, Ni—Sn, Ni—Co, Au alloy, SiC, GaP, GaAsP, InP, LiGaO$_2$, or LiAlO$_2$, or insulating material such as diamond, glass, polymer, epoxy, quartz, acryl, Al$_2$O$_3$, ZnO, or MN.

The first optical element 22 and/or the second optical element 28 can guide and/or extract light emitted from the light-emitting element 24 to the environment for improving the light extraction efficiency of the light-emitting device 2. The material of the first optical element 22 and/or the second optical element 28 can be transparent material such as epoxy, polyimide (PI), benzocyclobutene (BCB), perfluorocyclobutane (PFCB), Su8, acrylic resin, polymethyl methacrylate (PMMA), polyethylene terephthalate (PET), polycarbonate (PC), polyetherimide, fluorocarbon polymer, glass, Al$_2$O$_3$, SINR, spin-on-glass (SOG), or the combination thereof. In another embodiment, the first optical element 22 can be reflector including metal such as Cu, Al, Sn, Au, Ag, Ti, Ni, Ag—Ti, Ni—Sn, Au alloy, Ni—Ag, Ti—Al, or the combination thereof. In another embodiment, a reflective layer can be formed on the surfaces of the first topical element 22 to reflect the light from the light-emitting element 24. The material of the reflective layer can be the same as the aforementioned metal. The light from the light-emitting element 24 can be reflected by the first optical element 22 for improving the light extraction efficiency of the light-emitting device 2. The shape of the second optical element 28 includes but is not limited to triangle, semicircle, quarter circle, trapezoid, pentagon, or rectangle in the cross-sectional view. An encapsulant can be formed between the second optical element 28 and the light-emitting element 24 in another embodiment to improve the light extraction efficiency of the light-emitting device 2.

The light-emitting element 24 can be LED or Organic LED (OLED) and emit a first light with a first wavelength. The wavelength-converting layer 26 can receive the first light and generate a second light with a second wavelength, wherein the second wavelength is different from the first wavelength. The material of the wavelength-converting layer 26 can be phosphor such as yttrium aluminum garnet, silicate garnet, vanadate garnet, mixed oxides, alkaline earth metal silicates, alkaline earth metal sulfides, selenides, alkaline earth metal thlogallates, metal nitrides, metal oxo-nitrides and mixed molybdate-tungstate families, or mixed glass phosphors. The material of the wavelength-converting layer 26 can be semiconductor including more than one element selected from a group consisting of Ga, Al, In, As, P, N, Zn, Cd, and Se as well. The wavelength-converting layer 26 can be disposed on the light-emitting element 24 or be formed conformably around the contour thereof.

The bonding layer 21 can adhesively connect the first optical element 22 and/or the second optical element 28 with the second carrier 23. The material of the bonding layer 21 can be transparent material such as polyimide, BCB, PFCB, MgO, Su8, epoxy, acrylic resin, COC, PMMA, PET, PC, polyetherimide, fluorocarbon polymer, glass, $Al_2O_3$, SiO, $TiO_2$, $SiN_x$, SOG, and so on. The bonding layer 21 can be UV tape or foam as well.

The conductive structure 25 is for receiving external voltage. The materials of the conductive structure 25 can be transparent conductive material and/or metal material. The transparent conductive material includes but is not limited to ITO, InO, SnO, CTO, ATO, AZO, ZTO, ZnO, IZO, DLC, GZO, and so on. The metal material includes but is not limited to Cu, Al, In, Sn, Au, Pt, Zn, Ag, Ti, Ni, Pb, Pd, Ge, Ni, Cr, Cd, Co, Mn, Sb, Bi, Ga, W, Be, Ag—Ti, Cu—Sn, Cu—Zn, Cu—Cd, Sn—Pb—Sb, Sn—Pb—Zn, Ni—Sn, Ni—Co, Ag—Cu, Ge—Au, Au alloy, and so on. The area of the bottom surface of the conductive structure 25 is larger than that of the light-emitting element 24. It can be at least 2 times area of the bottom surface of the light-emitting element 24. The conductive structure 25 can effectively release the heat from the light-emitting element 24 for improving the efficiency thereof. In addition, there is an insulating-diffusing layer (not shown) formed between the light-emitting element 24 and the conductive structure 25 in another embodiment. The insulating-diffusing layer can reflect and diffuse the light from the light-emitting element 24 to improve the light extraction efficiency of the light-emitting device 2. The material of the insulating-diffusing layer includes but is not limited to epoxy, SiO, $Al_2O_3$, $TiO_2$, silicone, resin, or the combination thereof. In another embodiment, a reflective layer can be formed between the light-emitting element 24 and the conductive structure 25 to reflect the light from the light-emitting element 24. The material of the reflective layer can be the same as the aforementioned metal. The light from the light-emitting element 24 can be reflected by the reflective layer for improving the light extraction efficiency of the light-emitting device 2.

Figure 3:
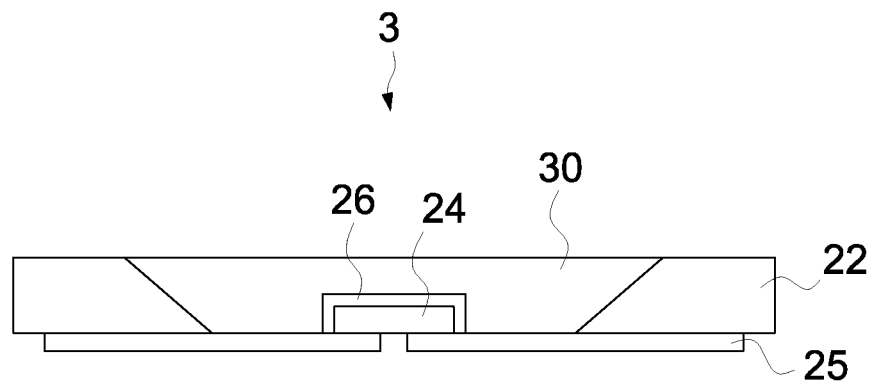
FIG. 3 illustrates a cross-sectional view of a light-emitting device in accordance with another embodiment of the present application.
Figure 4:
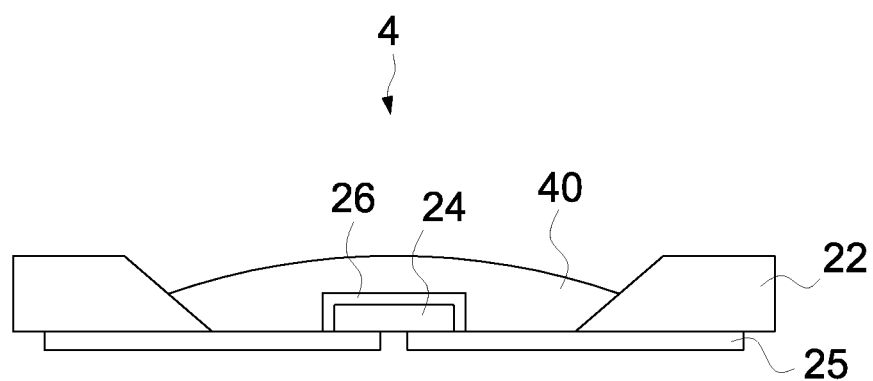
FIG. 4 illustrates a cross-sectional view of a light-emitting device in accordance with another embodiment of the present application.

FIG. 3 shows another embodiment that a light-emitting device 3 is similar to the light-emitting device 2. In addition, the light-emitting device 3 includes a second optical element 30 which has a top surface at the same elevation as that of the first optical element 22 in a cross-sectional view. The top surface of the second optical element 30 is flat so it benefits the bonding process and reinforcing the structure of the light-emitting device 2. FIG. 4 shows another embodiment that a light-emitting device 4 is similar to the light-emitting device 2. In addition, the light-emitting device 4 includes a second optical element 40 which has a top surface lower than that of the first optical element 22. Therefore, other optical elements can be formed easily on the second optical element 40 to tune the optical field for the application.

Figure 5:
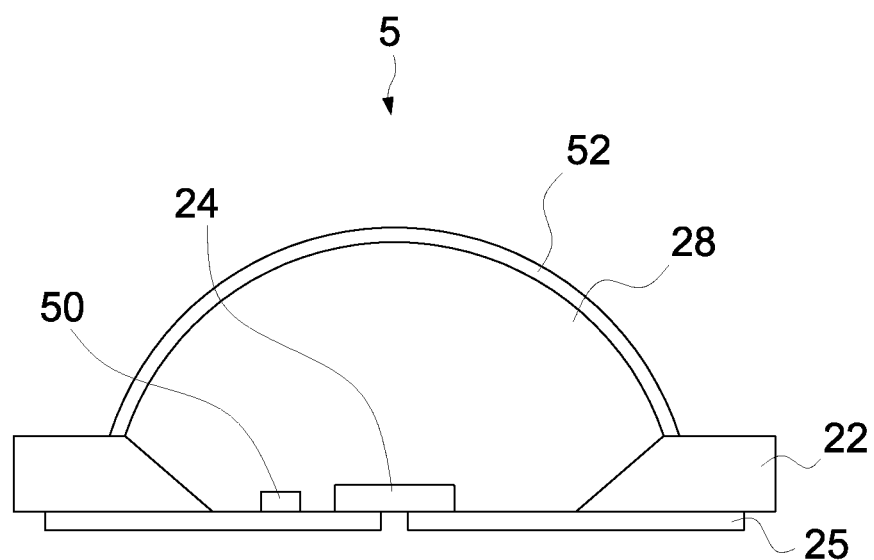
FIG. 5 illustrates a cross-sectional view of a light-emitting device in accordance with another embodiment of the present application.

Referring to FIG. 5, a light-emitting device 5 is similar to the light-emitting device 2. In addition, the light-emitting device 5 includes an electronic component 50 such as rectifier, protection component, capacity, resistance, and so on. The electronic component 50 having various functions can control the current of the light-emitting element 24 based of the requirement of the application. It can be formed within the step of forming the light-emitting element 24 of the above manufacturing process. Preferably, the amount of the electronic component 50 and the light-emitting element 24 can be more than two, so the steps of the manufacturing process are reduced and the cost of the manufacturing is lowered. The electronic component 50 and the light-emitting element 24 can be electrically connected by the conductive structure 25. The light-emitting device 5 further includes a wavelength-converting layer 52 on the second optical element 28.

Figure 6:
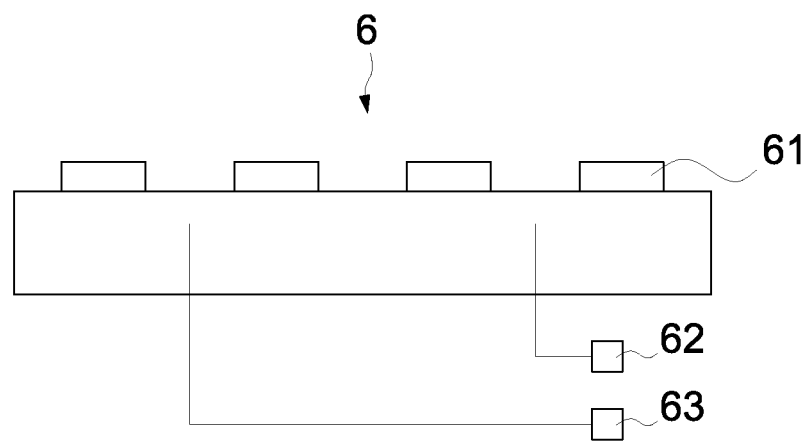
FIG. 6 illustrates a schematic diagram of a light-generating device in accordance with an embodiment of the present application.

FIG. 6 illustrates a schematic diagram of a light-generating device 6. The light-generating device 6 includes the light-emitting device of anyone of the foregoing embodiments of the present application. The light-generating device 6 can be an illumination device such as a street light, a lamp of vehicle, or an illustration source for interior. The light-generating device 6 can be also a traffic sign or a backlight of a backlight module of an LCD. The light-generating device 6 includes a light source 61 adopting any foregoing light-emitting devices; a power supplying system 62 providing current to the light source 61; and a control element 63 controlling the power supplying system 62.

Figure 7:
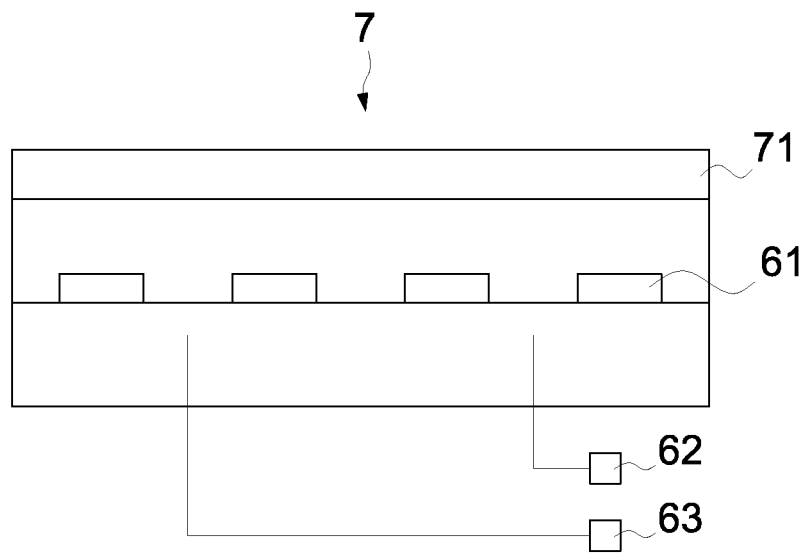
FIG. 7 illustrates a schematic diagram of a back light module in accordance with an embodiment of the present application.

FIG. 7 illustrates a schematic diagram of a backlight module 7. A backlight module 7 includes the light-generating device 6 of the foregoing embodiment and an optical element 71. The optical element 71 can process the light generated by the light-generating device 6 for LCD application, such as scattering the light emitted from the light-generating device 6.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of manufacturing a light-emitting device, comprising:

forming a first optical element on a first carrier, wherein the first optical element comprises an opening;

forming a light-emitting element in the opening;

forming a second optical element on the light-emitting element;

forming a second carrier on the first optical element and the second optical element;

removing the first carrier after forming the second carrier on the first optical element and the second optical element; and forming two separated conductive structures under the light-emitting element.

2. The method of claim 1, further comprising forming a wavelength-converting layer on the light-emitting element.

3. The method of claim 2, wherein forming the second optical element on the light-emitting element is after forming the wavelength-converting layer thereon.

4. The method of claim 1, further comprising forming a reflective layer on a surface of the first optical element.

5. The method of claim 1, further comprising forming an insulating-diffusing layer between the light-emitting element and the separated conductive structures.

6. The method of claim 1, further comprising forming a reflective layer between the light-emitting element and the separated conductive structures.

7. The method of claim 1, further comprising removing the second carrier.

8. The method of claim 1, further comprising forming a bonding layer under the second carrier and/or on the first optical element for bonding the second carrier to the first optical element.

9. The method of claim 1, further comprising forming an electronic component in the opening for controlling current of the light-emitting element.

10. The method of claim 9, wherein the electronic component electrically connects with the light-emitting element.

11. The method of claim 9, wherein the electronic component is selected from a group consisting of rectifier, protection component, capacity, and resistance.

12. The method of claim 1, wherein the opening exposes the first carrier.

13. The method of claim 1, wherein a material of the second optical element is selected from a group consisting of epoxy, polyimide, benzocyclobutene, perfluorocyclobutane, Su8, acrylic resin, polymethyl methacrylate, polyethylene terephthalate, polycarbonate, polyetherimide, fluorocarbon polymer, glass, Al2O3, SINR, and spin-on-glass.

14. The method of claim 1, further comprising forming an encapsulant between the light-emitting element and the second optical element.

15. The method of claim 1, further comprising forming a wavelength-converting layer on the second optical element.

16. The method of claim 1, wherein a shape of the second optical element is selected from a group consisting of triangle, semicircle, quarter circle, trapezoid, pentagon, and rectangle in a cross-sectional view.

17. The method of claim 1, wherein a top surface of the second optical element is at the same elevation as that of the first optical element in a cross-sectional view.

18. The method of claim 1, wherein a top surface of the second optical element is lower than that of the first optical element.

19. The method of claim 1, wherein the separated conductive structures electrically connect with the light-emitting element and are used for receiving external voltage.

* * * * *